(12) United States Patent
Kido et al.

(10) Patent No.: US 8,826,521 B2
(45) Date of Patent: Sep. 9, 2014

(54) COMPONENT PLACEMENT MACHINE

(75) Inventors: Kazuo Kido, Osaka (JP); Syoujirou Nishihara, Osaka (JP); Tatsuya Sano, Osaka (JP); Hidetoshi Suenaga, Osaka (JP); Takaki Fukami, Osaka (JP)

(73) Assignee: Panasonic Corporation, Osaka (JP)

( * ) Notice: Subject to any disclaimer, the term of this patent is extended or adjusted under 35 U.S.C. 154(b) by 349 days.

(21) Appl. No.: 13/254,487

(22) PCT Filed: Mar. 29, 2011

(86) PCT No.: PCT/JP2011/001851
§ 371 (c)(1),
(2), (4) Date: Sep. 2, 2011

(87) PCT Pub. No.: WO2011/121992
PCT Pub. Date: Oct. 6, 2011

(65) Prior Publication Data
US 2012/0045299 A1 Feb. 23, 2012

(30) Foreign Application Priority Data
Mar. 29, 2010 (JP) .................................. 2010-075959

(51) Int. Cl.
*B23P 19/00* (2006.01)
*H05K 13/04* (2006.01)

(52) U.S. Cl.
CPC ................................. *H05K 13/0408* (2013.01)
USPC ........................................ 29/740; 414/749.6

(58) Field of Classification Search
CPC ...... H05K 13/02; H05K 13/04; H05K 3/0008
USPC ................ 414/736, 737, 749.4–749.6, 751.1, 414/752.1; 198/468.3; 294/65
See application file for complete search history.

(56) References Cited

U.S. PATENT DOCUMENTS 5,046,391 A * 9/1991 Lewis et al. ..................... 83/489
7,356,918 B2 4/2008 Okuda et al.
(Continued)

FOREIGN PATENT DOCUMENTS

| CN | 1720769 | 1/2006 |
| CN | 1757276 | 4/2006 |

(Continued)

OTHER PUBLICATIONS

R. C. Hibbeler, Mechanics of Materials, 2008, Pearson Education, Inc., 7th, 371.*

(Continued)

*Primary Examiner* — Gregory Adams
*Assistant Examiner* — Ronald Jarrett
(74) *Attorney, Agent, or Firm* — Wenderoth, Lind & Ponack, L.L.P.

(57) ABSTRACT

Provided is a component placement machine including a rail (102) which extends along an X axis and slidably guides a head (101) along the X axis; an X beam (103) which has a bar shape, extends along the X axis, and has one side which is in a direction of a Y axis and on which the rail (102) is installed; and a Y beam (104) which extends along the Y axis and slidably guides the X beam (103) along the Y axis, and further including a reinforcement member (105) which acts against bending caused by difference in thermal expansion between the rail (102) and the X beam (103), is made of carbon fiber reinforced plastic, and is fastened, with first fasteners at three or more positions arranged along the X axis, to another side of the X beam (103) in the direction of the Y axis.

9 Claims, 7 Drawing Sheets

(56) References Cited

U.S. PATENT DOCUMENTS

| | | |
|---|---|---|
| 2004/0211909 A1 | 10/2004 | Watanabe |
| 2006/0048380 A1 | 3/2006 | Okuda et al. |
| 2006/0157658 A1 | 7/2006 | Watanabe |
| 2006/0236530 A1* | 10/2006 | Andersch .................. 29/740 |
| 2008/0250636 A1 | 10/2008 | Okuda et al. |

FOREIGN PATENT DOCUMENTS

| | | |
|---|---|---|
| JP | 2001-352200 | 12/2001 |
| JP | 2002-176294 | 6/2002 |
| JP | 2003-168898 | 6/2003 |
| JP | 2004-321568 | 11/2004 |
| JP | 2009-295823 | 12/2009 |

OTHER PUBLICATIONS

International Search Report issued Apr. 26, 2011 in corresponding International Application No. PCT/JP2011/001851.

Written Opinion of the International Searching Authority issued Apr. 26, 2011 in corresponding International Application No. PCT/JP2011/001851 (with English translation).

Office Action with Search Report mailed Jun. 5, 2014 in corresponding Chinese Application No. 201180001291.0, with English language translation of Search Report.

* cited by examiner

| | (a) | (b) | (c) | (d) |
|---|---|---|---|---|
| Weight percentage | 100 | 55.2 | 54.3 | 47.5 |
| Amount of bend (μm) | 26 | 6 | 37 | 23 |

FIG. 8

COMPONENT PLACEMENT MACHINE

TECHNICAL FIELD

The present invention relates to component placement machines which are equipment for manufacturing a mount board on which components are mounted, and particularly to a component placement machine including a beam for linear movement of a head.

BACKGROUND ART

There are conventional component placement machines which holds and carries a component from a component feeding unit to above a fixed board, and lowers the component to mount the component on the board. The placement machine is required to reproduce a position where the component being held is placed in X-Y directions (a horizontal plane). On the other hand, it is also required to carry the component from the component feeding unit to above the board, position the component in X-Y directions, and return to the component feeding unit after placing the component as quick as possible in order to increase productivity of the mount board.

The component placement machine is thus constructed with Y beams fixed to a base and extending along a Y axis, an X beam installed on the Y beams so as to be slidable along the Y beam, and a head installed on the X beam so as to be slidable along the X beam.

Here, the X beam is provided with rails which lineally guide the head by allowing the head to slide directly along the rails. The rails, which have friction with the head, contain, as a material, a metal which is heavy and resistant to the friction, for example. The X beam, which supports the rails and the head, has a high structural strength and contains a metal having a lighter weight as a material, so that the weight of the members which move along the Y beams is saved.

However, as the rails extending along an X axis and the X beam are made of different metals and joined together, the X beam bends due to a bimetallic effect when there is a change in temperature of the component placement machine. Such bend of the X beam makes it difficult for the component placement machine to accurately place components on a board and requires correction of data for moving the head in consideration of the bend, and therefore has a negative impact on the productivity of the component placement machine.

The techniques disclosed in PTL1, PTL2, and PTL3 prevent an X beam from bending by bar-shaped reinforcement members which are made of the same material as the rails and provided on a side of the X beam opposite to the side on which rails are mounted. Bends of the rails and the X beam are thus compensated by bends of the reinforcement members the X beam, so that the straightness of the rail is retained.

CITATION LIST

Patent Literature

[PTL 1] Japanese Unexamined Patent Application Publication Number 2002-176294
[PTL 2] Japanese Unexamined Patent Application Publication Number 2003-168898
[PTL 3] Japanese Unexamined Patent Application Publication Number 2001-352200

SUMMARY OF INVENTION

Technical Problem

The reinforcement members need to have the same properties as the rails, such as a coefficient of linear expansion, to compensate the bend of the rails and the X beam. The X beam is provided with reinforcement members having approximately the same shape and the same weight as the rails such that thermal expansions in directions along the X axis and thermal stresses balance out, and therefore the total weight of the members installed on the X beam increases. The increase in the weight makes it difficult for the X beam to move quickly, and therefore causing difficulty in increasing productivity of the component placement machine.

In view of this, the inventors of the present invention intensively conducted studies and experiments, and as a result, they selected carbon fiber reinforced plastic (CFRP) as a material for a reinforcement member which keeps an X beam straight not by compensating distortion between rails and the X beam with distortion between the reinforcement member and the X beam but by acting against bending of the X beam caused by the rails by suppressing thermal expansion at one side of the X beam opposite to the side on which the rails are installed. The carbon fiber reinforced plastic has a higher strength-to-weight ratio and a smaller coefficient of linear expansion than the material for the rails. A reinforcement member made of the carbon fiber reinforced plastic is therefore lighter than the reinforcement member made of the same material as the rails, and has such a small coefficient of linear expansion due to heat as to act against bending of the X beam.

Then, the inventors' further intensive studies and experiments found modes of installing a member containing carbon fiber reinforced plastic to achieve effective suppression of bend of the X beam.

The present invention is based on the findings and has an object of providing a component placement machine in which the carbon fiber reinforced plastic is used in such a manner as to effectively act against bending of the X beam.

Solution to Problem

In order to achieve the object, the component placement machine according to an aspect of the present invention which includes a rail which extends along an X axis and slidably guides a head along the X axis; an X beam which has a bar shape, extends along the X axis, and has one side which is in a direction of a Y axis and on which the rail is installed; and a Y beam which extends along the Y axis and slidably guides the X beam along the Y axis, includes a reinforcement member which acts against bending of the X beam, is made of carbon fiber reinforced plastic, and is fastened, with first fasteners at three or more positions arranged along the X axis, to an other side of the X beam in the direction of the Y axis, the bending being caused by difference in thermal expansion between the rail and the X beam.

The X beam and the reinforcement member made of carbon fiber reinforced plastic are thus structurally joined together without adhesive generally used for joining a member made of carbon fiber reinforced plastic. As a result, the total weight of the members moving along the Y beams is reduced while the X beam is retained straight against bending of the X beam. In addition, the reinforcement member is fastened to the X beam more easily than when adhesive is used, so that assembly costs for the component placement machine can be reduced. Furthermore, as the X beam and the reinforcement member are separated easily, recycling of the components is facilitated.

It is to be noted that the above description does not mean that the present invention excludes use of adhesive for joining the reinforcement member and the X beam. Using adhesive with such fasteners is still within the scope of the present invention.

Furthermore, the rail is preferably fastened to the one side of the X beam in the direction of the Y axis, with second fasteners at three or more positions arranged along the X axis, and the first fasteners fastening the reinforcement member to the X beam are preferably arranged along the X axis at a pitch which is equal to or shorter than a pitch at which the second fasteners fastening the rail to the X beam are arranged along the X axis.

With this, the reinforcement member can effectively act against bending of the X beam. Such a preferable configuration of the pitches is obtained empirically through experiments, which will be described in the section of the embodiment below.

Furthermore, the first fasteners fastening the reinforcement member to the X beam are preferably arranged along the X axis at a pitch which is one n-th of a pitch at which the second fasteners fastening the rail to the X beam are arranged along the X axis, where n is a natural number.

Furthermore, the positions of the first fasteners on the X axis are preferably identical to the positions of the second fasteners on the X axis.

With this, the reinforcement member can effectively act against bending of the X beam.

It is to be noted that the idea about the correspondence of the pitches is experimentally and empirically derived, and thus it is difficult to give a detailed explanation for how it works. The following is one of possible principles.

Forces which are generated by the difference in thermal expansion between the rails and the X beam and cause the X beam to bend are generated at positions where the second fasteners are installed to fasten the rails to the X beam. Therefore, stresses are generated in the X beam at the same pitch as the pitch at which the second fasteners are installed. On the other hand, forces are applied to the X beam via the first fasteners. The forces suppress the thermal expansion of the X beam in directions along the X axis and act against bending of the X beam on the other side of the X beam in the Y-axis direction. The other side in the Y-axis direction is the side opposite to the side on which the rails are installed, When the first fasteners are arranged at a pitch wider than the pitch at which the second fasteners are arranged, the forces against bending is applied at points fewer than the points at which the forces causing bend are applied, and intervals between the points are longer. As a result, a force acting at a point against bending increases, so that the load on the reinforcement member, which generates the forces against the bending increases.

The X beam is retained straight most effectively when the positions of the first fasteners on the X axis are identical to the positions of the second fasteners on the X axis because the forces to bend the X beam and forces against the bending the X beam acts in an opposing manner in the directions perpendicular to the X axis (that is, along the Y axis).

Furthermore, the first fasteners may include screws, and the reinforcement member may have insertion holes through which the screws are inserted.

It has been considered that providing insertion holes in the reinforcement member made of carbon fiber reinforced plastic should be avoided because it may degrade the strength of the reinforcement member. However, the inventors of the present invention have found through the intensive studies and experiments that the reinforcement member sufficiently acts against bending of the X beam as long as the strength of the reinforcement member satisfies a requirement between adjacent first fasteners even in the case where the strength of the reinforcement member fails to satisfy the requirement at the fastening positions.

In addition, the reinforcement member may be easily attached to and detached from the X beam when the reinforcement member has such insertion holes. This thereby facilitates maintenance such as replacement of the reinforcement members. In addition, the present invention can be implemented at low cost because screws, which are typical and versatile fasteners, can be used as the first fasteners.

Furthermore, the first fasteners fastening the reinforcement member to the X beam are arranged along the X axis at a pitch of 70 mm or shorter.

With this, the X beam can be effectively retained straight. Such features of pitches are obtained empirically through experiments, which will be described in the section of the embodiment below.

Furthermore, the X beam may have a Y-Z cross-section having a shape which is symmetric with respect to the Y axis and has Z-axial width narrowing gradually up to the other side of the X beam in the direction of the Y axis.

With this, the weight of the X beam is reduced so that the total weight of the members moving along the Y beam can be reduced.

Advantageous Effects of Invention

The present invention provides a component placement machine including an X beam which is lightweight and hard to bend and contributes to higher productivity with faster component placement and increased accuracy in positioning.

DESCRIPTION OF EMBODIMENTS

The following describes a component placement machine according to an embodiment of the present invention with reference to the drawings.

Figure 1:
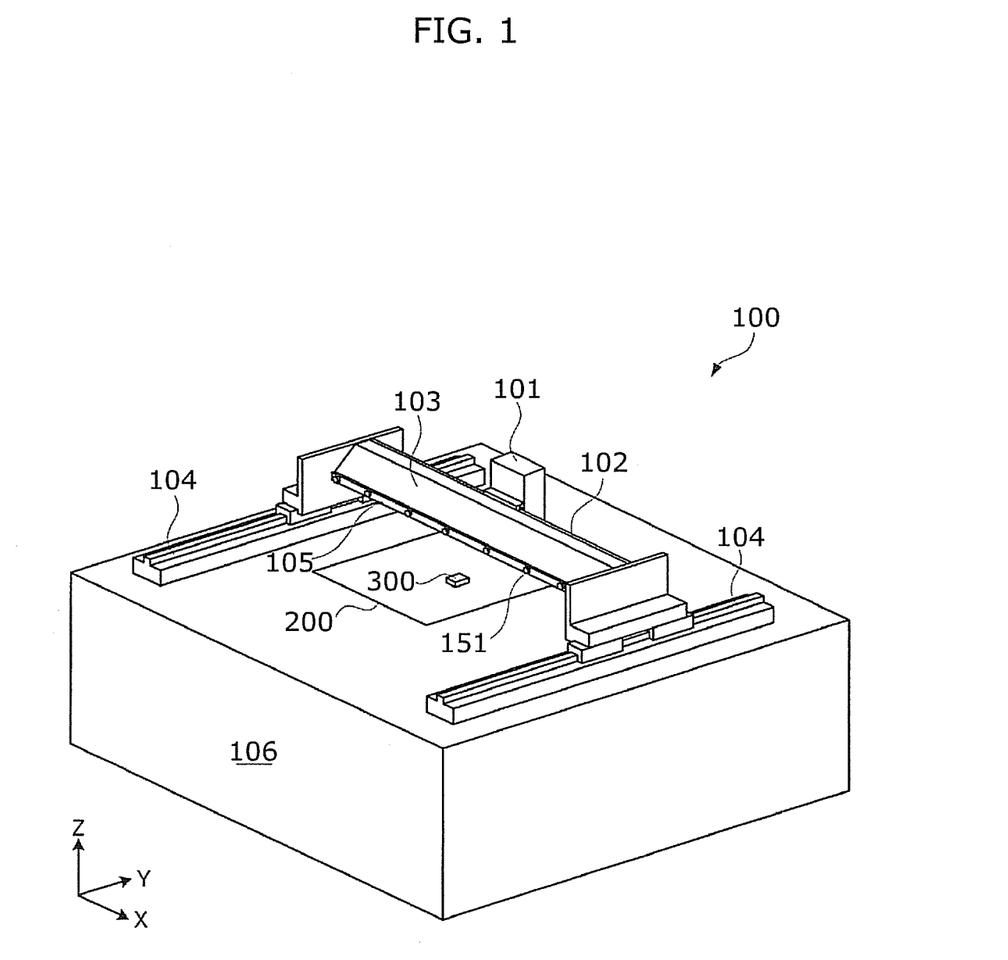
FIG. 1 shows a perspective view schematically illustrating the component placement machine.

FIG. 1 shows a perspective view schematically illustrating the component placement machine.

As shown in FIG. 1, a component placement machine 100 carries a component 300 from a component feeding unit (not shown) to above a board 200 and places the component 300 on the board 200. The component placement machine 100 includes a head 101, rails 102, an X beam 103, Y beams 104, and a reinforcement member 105.

The head 101 includes holding units 111 (see FIG. 2, etc.) which are each capable of holding a component 300 in a detachable manner and which are installed on the rails 102 so as to reciprocably move along the X axis.

In this embodiment, the holding units 111 are nozzles which hold the component 300 with vacuum. The head 101 includes eight of the holding units 111. The head 101 has a mechanism to move the holding units 111 along a Z axis independently of each other and a function of holding component 300 to carry and place the component 300 on the board 200.

The head 101 is not limited to a device for mounting the component 300 on the board 200 and may be a device for inspecting the component 300 or a device for applying a resin to bond the component 300 to the board 200.

The Y beams 104 are members which slidably guide the X beam 103 along the Y axis. In this embodiment, two of the Y beams 104, extending along the Y axis, are arranged parallel to each other and fixed to a base 106.

The Y beams 104 may be formed integrally with the base 106.

Figure 2:
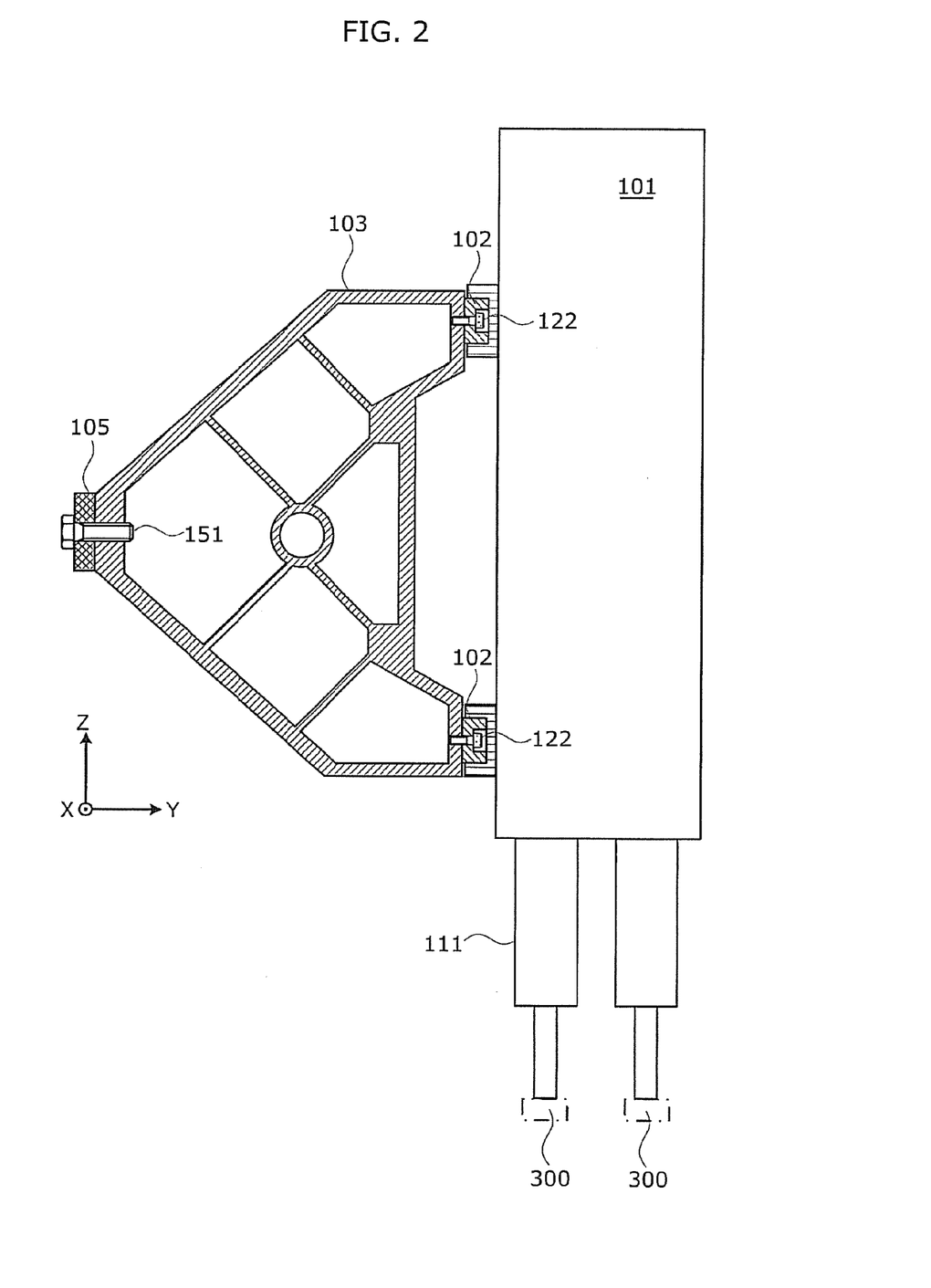
FIG. 2 shows a plan view illustrating a cross-section of the X beam and a side view of the head.

FIG. 2 shows a plan view illustrating a cross-section of the X beam and a side view of the head.

Figure 3:
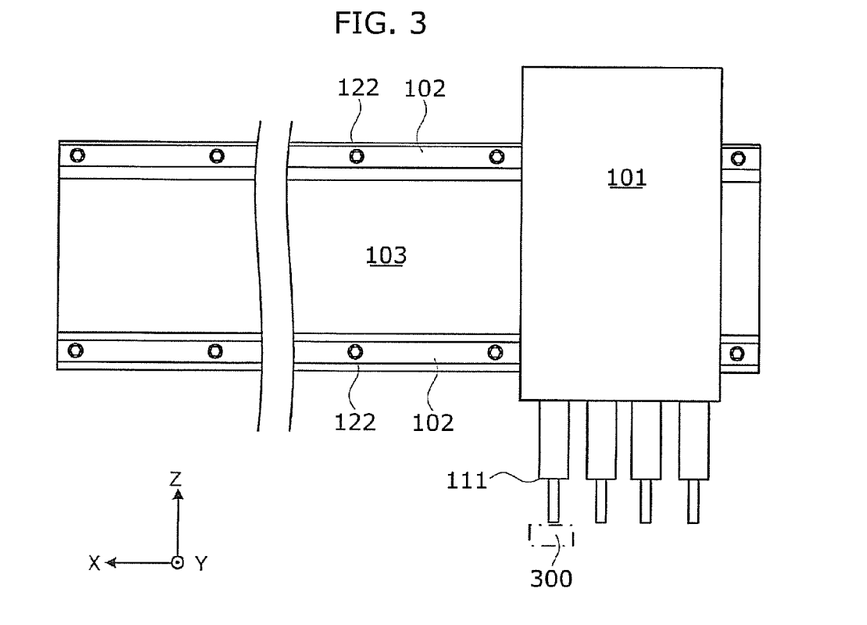
FIG. 3 shows a plan view illustrating a back view of the X beam and the head.

FIG. 3 shows a plan view illustrating a back view of the X beam and the head.

As shown in FIG. 2 and FIG. 3, the rails 102 are bar-shaped members extending along the X axis and slidably guide the head 101 along the X axis.

In the embodiment, the component placement machine 100 includes two of the rails 102 arranged parallel to each other side by side in the Z-axial direction.

Because the rails 102 relatively slide along the head 101, causing friction therebetween, steels such as SCM 435 are selected as a material for the rails 102.

The rails 102 are fastened to one of the sides of the X beam 103 in the Y-axis direction, each with second fasteners 122 at three or more positions arranged along the X axis. Specifically, the second fasteners 122 are hexagon socket head cap screws. The rails 102 are installed on the X beam 103 by threadedly installing the second fasteners 122 into threaded holes in the X beam 103. In this embodiment, the second fasteners 122 are arranged at a constant pitch of 60 mm along the X axis.

Figure 4:
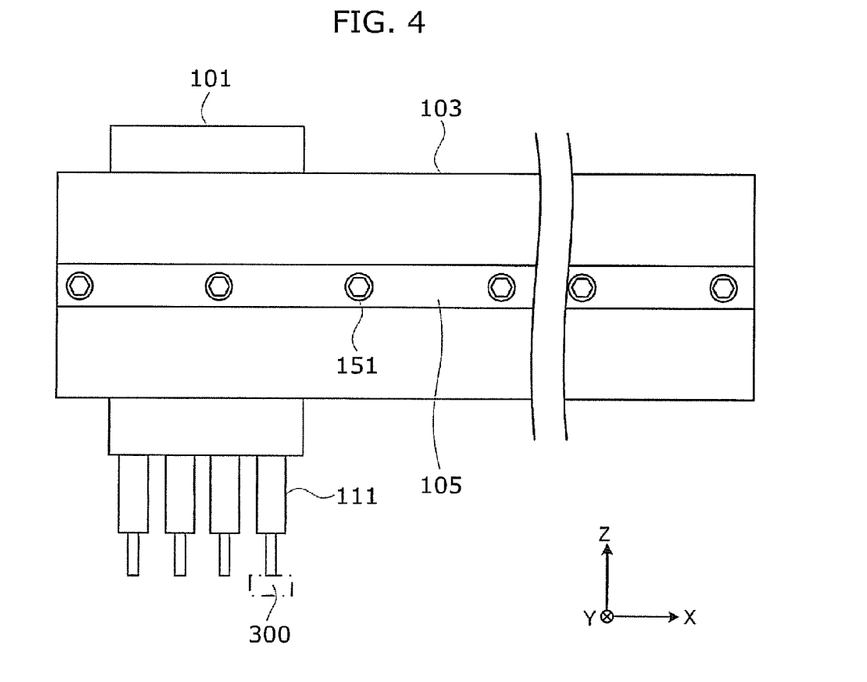
FIG. 4 shows a plan view illustrating a front side of the X beam and the head.

FIG. 4 shows a plan view illustrating a front side of the X beam and the head.

As shown in FIG. 2 and FIG. 4, the X beam 103 is a bar-shaped member extending along the X axis and has one side which is in the Y-axis direction and on which the rails 102 are installed.

In this embodiment, the Y-Z cross-section of the X beam 103 has a shape which is symmetric with respect to a Y axis and has Z-axial width narrowing gradually up to the other side of the X beam 103 in the Y-axis direction (see FIG. 2). The X beam 103 having the cross-section of such a shape is lighter than the X beam having a square cross-section with sides of a length equivalent to the distance between the two rails 102.

In addition, the X beam 103 having the cross-section of such a shape is capable of focusing the stresses, which are caused by difference in thermal expansion between the two rails 102 and the X beam 103 and cause the X beam 103 to bend, into a small portion at the other side of the X beam 103 away from the rails 102, that is, into a portion at a side of the X beam 103 opposite to the side which is in the Y-axis direction and on which the rails 102 are installed. Therefore, use of the carbon fiber reinforced plastic, which is capable of acting against the focused stresses, as a material for the reinforcement member 105 installed on the other side of the X beam 103 prevents thermal expansion of the X beam 103 in directions along the X axis in the side opposite to the side having the rails 102 installed thereon, so that the bend of the X beam 103 due to difference in thermal expansion from the rails 102 made of a different material is suppressed and the X beam 103 is retained straight. In addition, the weight of the members which move along the Y beams 104 can be reduced because the prevention of the bend of the entire X beam 103 is achieved by the single reinforcement member 105.

In addition, because of the shape narrowing in the Z-axis direction symmetrically with respect to a Y axis, the stresses are evenly transmitted to the reinforcement member 105 so that a twist in the X beam 103 is suppressed.

Generally, the X beam 103 is a member supporting, along the X axis, the rails 102 which guide reciprocating movement of the head 101 along the X axis. If the X beam 103 causes the head 101 to tremble in such reciprocating movement, the head 101 may have problems, such as the dropping of the component 300. In addition, deflection in the X beam 103 should be minimized so that the component 300 is carried to an exact location. The X beam 103 is therefore required to have sufficient structural strength. On the other hand, the X beam 103 is a member which lineally reciprocates along the Y beams 104, together with the rails 102 and the head 101. Therefore, the lighter the X beam 103 is, the faster the X beam 103 can carry the component 300.

The X beam 103 is a drawn material of aluminum or an aluminum-based alloy. The X beam 103 has a hollow structure including a number of ribs which secures structural strength of the X beam.

Figure 5:
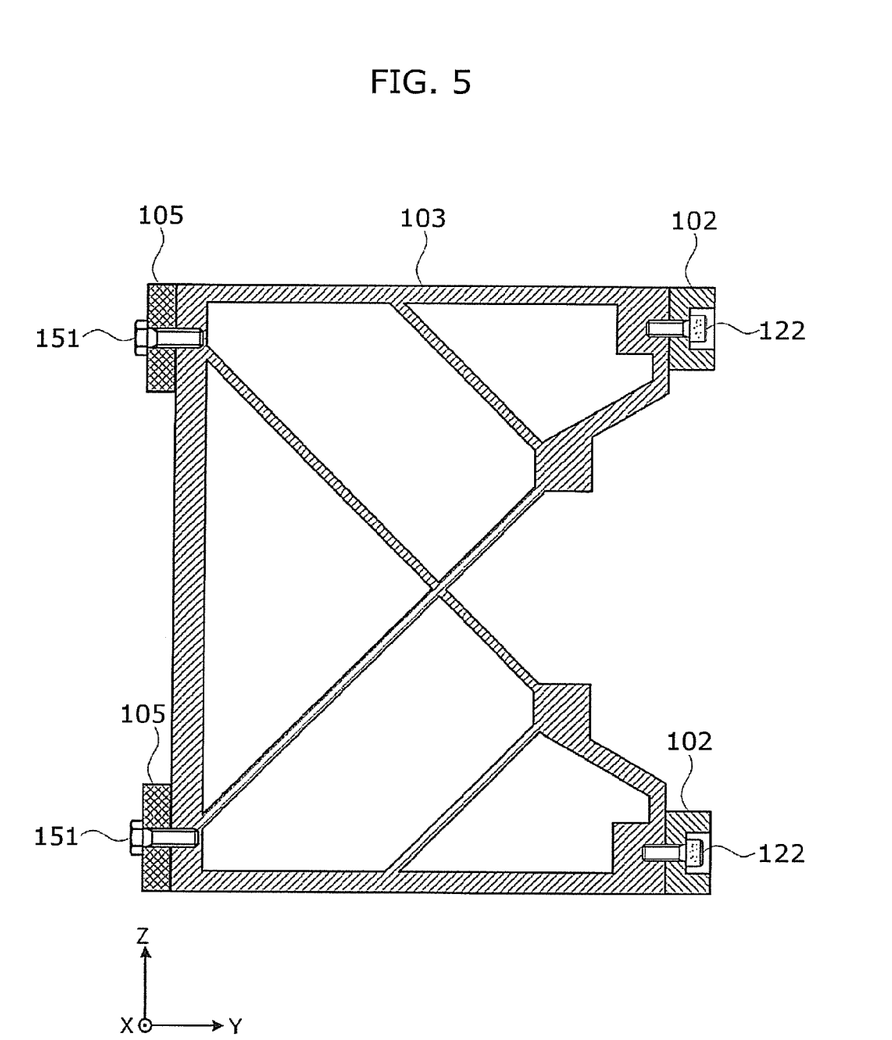
FIG. 5 shows a plan view illustrating a cross-section of an X beam according to another embodiment.

Alternatively, the X beam 103 may have a rectangular cross-section as shown in FIG. 5. Alternatively, the X beam 103 may be provided with a plurality of reinforcement members 105.

The reinforcement member 105 is a member which resists the bend of the X beam 103 due to difference in thermal expansion in directions along the X axis between the rails 102 and the X beam 103 so that the X beam 103 is retained straight. In addition, the material for the reinforcement member 105 includes carbon fiber reinforced plastic. The reinforcement member 105 is fastened to the other side of the X beam 103 in the Y-axis direction with first fasteners 151 provided at three or more positions arranged along the X axis.

In this embodiment, the first fasteners 151 are hexagon head screws. The reinforcement member 105 is installed on the X beam 103 by threadedly installing the first fasteners 151 through threaded holes in the X beam 103. In addition, the reinforcement member 105 has insertion holes (not shown) through which screws, that is, the first fasteners 151, are inserted. The insertion holes may be formed by drilling through the reinforcement members 105 formed to have an elongated shape. Alternatively, the reinforcement members 105 may be molded to have the insertion holes.

The reinforcement member 105 made of carbon fiber reinforced plastic preferably has a coefficient of linear expansion which is 3.5% of the coefficient of linear expansion of the rails 102 or smaller. This is because the reinforcement member 105 cannot be resistant enough to the bend of the X beam 103 caused by the rails 102 when change in the length of the reinforcement member 105 due to change in temperature is not small enough compared to the change in the length of the rails 102.

The reinforcement member 105 preferably has a thickness of 6 mm or smaller in consideration of machinability to form the insertion holes. The reinforcement member 105 having a thickness of approximately 3 mm is still capable of suppressing the bend sufficiently. The reinforcement member 105 preferably has a width between 10 mm and 100 mm. The reinforcement member 105 preferably has the same length as the rails 102.

The first fasteners 151 preferably fasten the reinforcement member 105 at least three positions including the center and the end portions of the reinforcement member 105 in the X-axis direction. In this embodiment, the positions of the first fasteners 151 on the X-axis are identical to the positions of the second fasteners 122 on the X axis. The first fasteners 151 and the second fasteners 122 are arranged along the X axis at the same pitch, that is, at a constant pitch of 60 mm.

Figure 6:
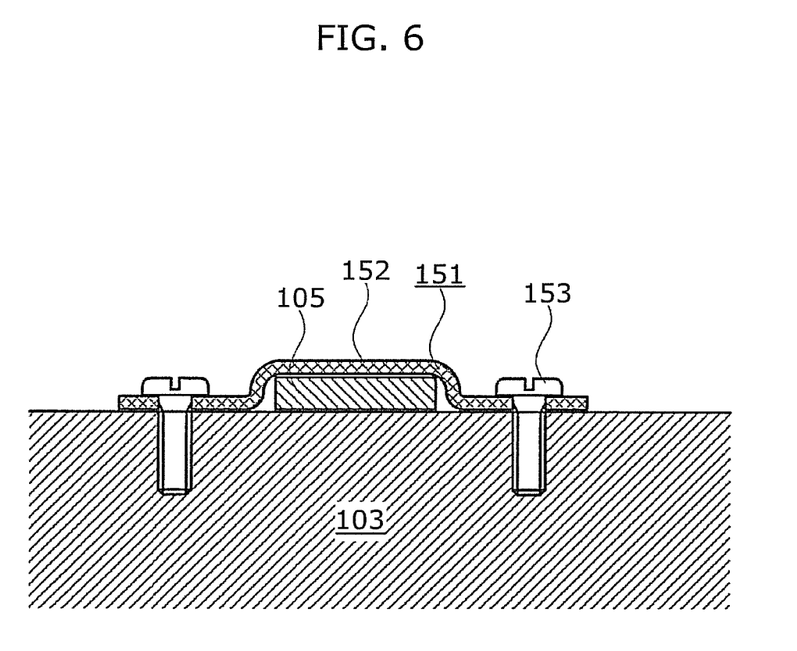
FIG. 6 shows a plan view illustrating another example of first fasteners.

It is to be noted that the first fasteners 151 are not limited to such screws. For example, the reinforcement member 105 may be fastened to the X beam 103 using rivets as the first fasteners 151. Alternatively, the first fasteners 151 may be fastened to the X beam 103 using pressing members 152 and set screws 153 in a manner such that the reinforcement member 105 between the X beam 103 and the pressing members 152 is fastened by tightening the set screws 153 as shown in FIG. 6. In this case, the reinforcement member 105 has no insertion hole.

The following describes examples of the present invention.

Figure 7:
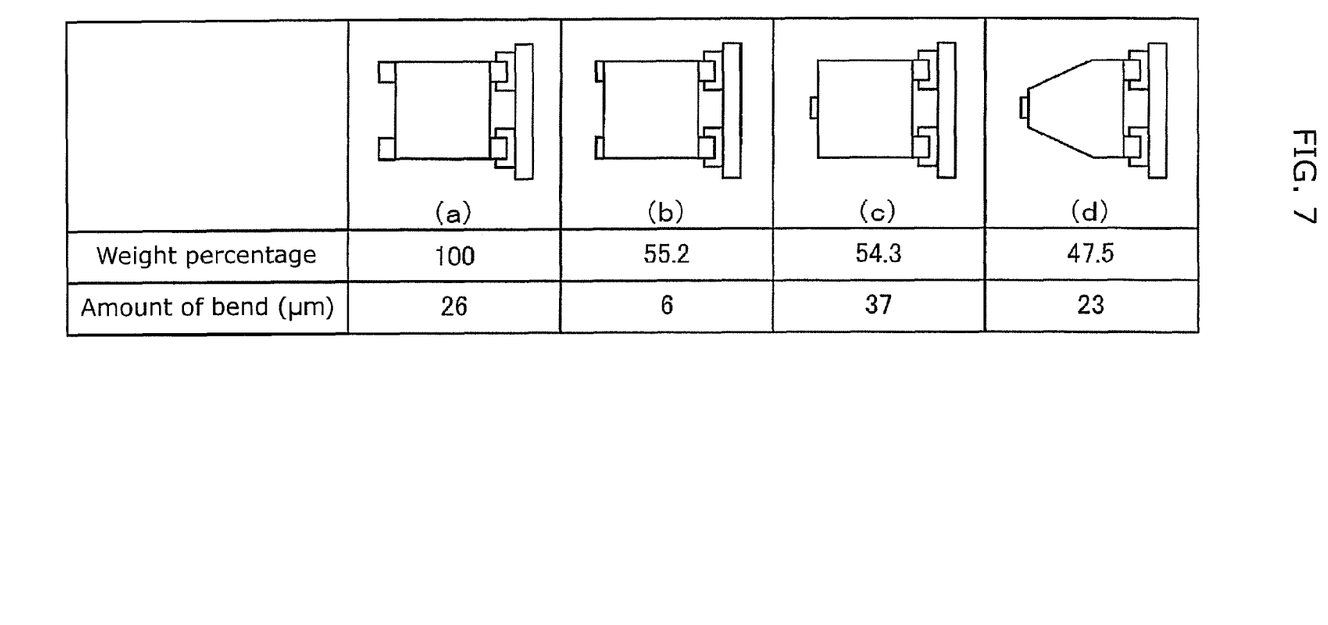
FIG. 7 shows a table representing the effects of the present invention.

FIG. 7 shows a table representing the effects of the present invention.

(a) of FIG. 7 shows a comparative example in which an X beam having a rectangular cross-section, rails made of steel, and reinforcement members are used. The reinforcement members are made of the same material as the rails. (b) of FIG. 7 shows an example of the present invention, in which an X beam having a rectangular cross-section, rails made of steel, and two reinforcement members made of carbon fiber reinforced plastic are used. (c) of FIG. 7 shows an example of the present invention, in which an X beam having a rectangular cross-section, two rails made of steel, and a reinforcement member made of carbon fiber reinforced plastic and mounted at a position equidistant from the two rails are used. (d) of FIG. 7 shows an example of the present invention, in which an X beam having a cross-section gradually narrowing toward one side in the Y-axis direction, two rails made of steel, and a reinforcement member made of carbon fiber reinforced plastic and installed at a position equidistant from the two rails are used.

Referring to FIG. 7 for comparison with the comparative example shown in (a), changing the material for the reinforcement member to carbon fiber reinforced plastic achieves reduction in weight to approximately 55% of the weight in the comparative example. Further, in the case where the X beam has the shape narrowing toward one side in the Y-axis direction, the weight is reduced to less than half, approximately 47% of the weight in the comparative example.

In the requirement specification, the X beam of the component placement machine has an amount of bend of 50 μm or smaller for temperature increase from 20 degrees Celsius to 35 degrees Celsius. In the comparative example shown in (a), the X beam has an amount of bend of 26 μm, satisfying the requirement specification. On the other hand, the X beam shown in (b) having the two reinforcement members made of carbon fiber reinforced plastic has an amount of bend at a one-digit level, showing that the two reinforcement members are capable of retaining the X beam more straight. The X beam having one reinforcement member of carbon fiber reinforced plastic shown in (c) has a larger amount of bend than the X beam shown in (a), but the X beam shown in (c) still satisfies the requirement specification. Furthermore, referring to (d), the X beam having the shape narrowing toward one side in the Y-axis direction has approximately the same amount of bend as in the X beam shown in the comparative example (a).

The amount of bend shown in (d) is smaller than the amount of bend shown in (C) because the X beam having such a cross-sectional shape focuses the stresses caused by the rails arranged side by side in the Z-axis direction into the portion where the reinforcement member is installed while the reinforcement member made of carbon fiber reinforced plastic, which slightly shrinks due to its nature when the temperature increases, generates stresses in such directions as to compensate the stresses caused by the rails and acts against the stresses caused by the rails by retaining its own shape (extending along the X axis).

It is to be noted that the rails are fastened to the X beam with screws, which are the second fasteners, at a constant pitch of 60 mm, and that the reinforcement member is fastened to the X beam with screws, which are the first fasteners, at a constant pitch of 60 mm to be located at the X-axial positions corresponding to the X-axial positions of the respective second fasteners. It is also to be noted that the amount of bend is the amount of displacement of one lengthwise end of the X beam with the other lengthwise end fixed.

Figure 8:
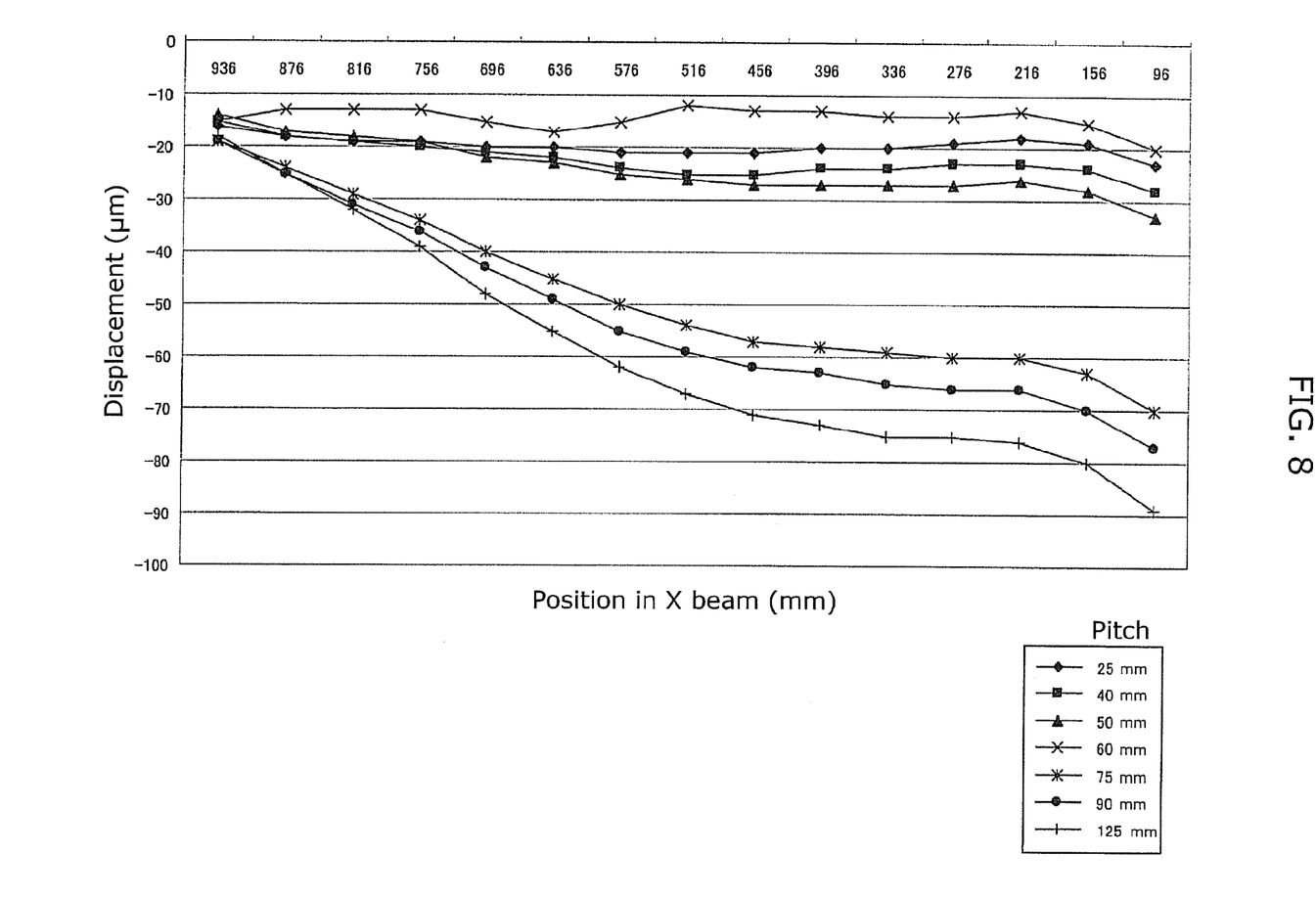
FIG. 8 shows a graph indicating a bend of the X beam for different pitches between the first fasteners.

FIG. 8 shows a graph indicating the bend of the X beam for different pitches between the first fasteners.

The graph shows a result of an experiment in which a reinforcement member is fastened, with first fasteners arranged at different pitches, to an X beam which is made of aluminum or aluminum alloy and to which rails made of steel such as SCM 435 are fastened with screws which are the second fasteners arranged at a pitch of 60 mm.

As shown in the graph, the requirement specification is satisfied when the pitch at which the first fasteners fastens the reinforcement member to the X beam is equal to or shorter than the pitch at which the second fasteners fastens the rails to the X beam, and the requirement specification is not satisfied when the pitch between the first fasteners is longer than the pitch between the second fasteners. In addition, when the pitch between the second fasteners is longer than 70 mm, it is difficult to secure sufficient strength of rails fastened. It is therefore preferable that the pitch between the first fasteners be 70 mm or shorter. It is more preferable that the second fasteners to fasten the rails to the X beam and the first fasteners to fasten the reinforcement member to the X beam be arranged at the same pitch. Both of the pitches are preferably 60 mm, for example.

The X beam and the reinforcement member made of carbon fiber reinforced plastic are thus structurally joined together without adhesive generally used for joining a member made of carbon fiber reinforced plastic. As a result, the total weight of the members moving along the Y beams is reduced while the X beam is retained straight against bending of the X beam. In addition, the reinforcement member is fastened to the X beam more easily than when adhesive is used, so that assembly costs for the component placement machine can be reduced. Furthermore, as the X beam and the reinforcement member are separated easily, recycling of the components is facilitated. The component placement machine according to the present invention thus has the amount of bend of the X beam 103 reduced to be smaller than the requirement specification, the members moving along the Y beams 104 having a reduced weight, and achieves quick and accurate placement of the component 300 on the board 200.

INDUSTRIAL APPLICABILITY

The present invention is applicable to a component placement machine which moves a head in X-Y directions fast, such as a component placement machine which places components on a board, and an inspection machine which inspects components mounted on a board and a coating machine which applies adhesive or the like to a board.

REFERENCE SIGNS LIST

100 Component placement machine
101 Head
102 Rail
103 X beam
104 Y beam
105 Reinforcement member
106 Base
111 Holding unit
122 Second fastener
151 First fastener
152 Pressing member
153 Set screw
200 Board
300 Component

The invention claimed is:

1. A component placement machine comprising:
an X beam which has a bar shape extending along an X axis, said X beam being made of a metal;
a rail which extends along the X axis and slidably guides a head along the X axis, said rail being fastened to one side of said X beam in a direction of a Y axis, said rail being made of a metal which is different from that of said X beam;
a reinforcement member which acts against bending of said X beam, said reinforcement member being made of carbon fiber reinforced plastic, and being fastened, with first fasteners at three or more positions arranged along the X axis, to another side of said X beam in the direction of the Y axis, the bending being caused by a difference in thermal expansion between said rail and said X beam, said another side of said X beam being a side opposite to said one side of said X beam to which said rail is fastened; and
a Y beam which extends along the Y axis and slidably guides said X beam along the Y axis,
wherein said rail is fastened to said one side of said X beam with second fasteners at three or more positions arranged along the X axis, and
wherein said first fasteners fastening said reinforcement member to said X beam are arranged along the X axis at a pitch which is shorter than or equal to a pitch at which said second fasteners fastening said rail to said X beam are arranged along the X axis.

2. The component placement machine according to claim 1,
wherein said first fasteners fastening said reinforcement member to said X beam are arranged along the X axis at a pitch which is one n-th of a pitch at which said second fasteners fastening said rail to said X beam are arranged along the X axis, where n is a natural number.

3. The component placement machine according to claim 2,
wherein the positions of said first fasteners on the X axis are identical to the positions of said second fasteners on the X axis.

4. The component placement machine according to claim 1,
wherein said first fasteners include screws, and
said reinforcement member has insertion holes through which said screws are inserted.

5. A component placement machine comprising:
an X beam which has a bar shape extending along an X axis, said X beam being made of a metal;
a rail which extends along the X axis and slidably guides a head along the X axis, said rail being fastened to one side of said X beam in a direction of a Y axis, said rail being made of a metal which is different from that of said X beam;
a reinforcement member which acts against bending of said X beam, said reinforcement member being made of carbon fiber reinforced plastic, and being fastened, with first fasteners at three or more positions arranged along the X axis, to another side of said X beam in the direction of the Y axis, the bending being caused by a difference in thermal expansion between said rail and said X beam, said another side of said X beam being a side opposite to said one side of said X beam to which said rail is fastened; and
a Y beam which extends along the Y axis and slidably guides said X beam along the Y axis,
wherein said rail is fastened to said one side of said X beam with second fasteners at three or more positions arranged along the X axis, and
wherein said first fasteners fastening said reinforcement member to said X beam are arranged along the X axis at a pitch of 70 mm or shorter.

6. A component placement machine comprising:
an X beam which has a bar shape extending along an X axis, said X beam being made of a metal;
a rail which extends along the X axis and slidably guides a head along the X axis, said rail being fastened to one side of said X beam in a direction of a Y axis, said rail being made of a metal which is different from that of said X beam;
a reinforcement member which acts against bending of said X beam, said reinforcement member being made of carbon fiber reinforced plastic, and being installed on another side of said X beam in the direction of the Y axis, the bending being caused by a difference in thermal expansion between said rail and said X beam, said another side of said X beam being a side opposite to said one side of said X beam to which said rail is fastened; and
a Y beam which extends along the Y axis and slidably guides said X beam along the Y axis,
wherein said rail is fastened to said one side of said X beam with second fasteners at three or more positions arranged along the X axis, and
wherein said X beam has a Y-Z cross-section having a shape which is symmetric with respect to the Y axis and has Z-axial width narrowing gradually up to said another side of said X beam in the direction of the Y axis.

7. A method of placing a component on a board, said method being performed using a component placement machine which comprises:
an X beam which has a bar shape extending along an X axis, the X beam being made of a metal;
a rail which extends along the X axis and slidably guides a head along the X axis, the rail being fastened to one side of the X beam in a direction of a Y axis, the rail being made of a metal which is different from that of the X beam;
a reinforcement member which acts against bending of the X beam, the reinforcement member being made of carbon fiber reinforced plastic, and being fastened, with first fasteners at three or more positions arranged along the X axis, to another side of the X beam in the direction of the Y axis, the bending being caused by a difference in thermal expansion between the rail and the X beam, the another side of the X beam being a side opposite to the one side of the X beam to which the rail is fastened; and a Y beam which extends along the Y axis and slidably guides the X beam along the Y axis, wherein the rail is fastened to the one side of the X beam with second fasteners at three or more positions arranged along the X axis, and wherein the first fasteners fastening the reinforcement member to the X beam are arranged along the X axis at a pitch which is equal to or shorter than or equal to a pitch at which the second fasteners fastening the rail to the X beam are arranged along the X axis, said method comprising sliding the head, which holds the component, on the rail so as to move along the X axis and sliding the X beam on the Y beam so as to move along the Y axis such that the head is positioned above the board, and placing the component on the board by the head.

8. A method of placing a component on a board, said method being performed using a component placement machine which comprises:

an X beam which has a bar shape extending along an X axis, the X beam being made of a metal;

a rail which extends along the X axis and slidably guides a head along the X axis, the rail being fastened to one side of the X beam in a direction of a Y axis, the rail being made of a metal which is different from that of the X beam;

a reinforcement member which acts against bending of the X beam, the reinforcement member being made of carbon fiber reinforced plastic, and being fastened, with first fasteners at three or more positions arranged along the X axis, to another side of the X beam in the direction of the Y axis, the bending being caused by a difference in thermal expansion between the rail and the X beam, the another side of the X beam being a side opposite to the one side of the X beam to which the rail is fastened; and a Y beam which extends along the Y axis and slidably guides the X beam along the Y axis, wherein the rail is fastened to the one side of the X beam with second fasteners at three or more positions arranged along the X axis, and wherein the first fasteners fastening the reinforcement member to the X beam are arranged along the X axis at a pitch of 70 mm or shorter, said method comprising sliding the head, which holds the component, on the rail so as to move along the X axis and sliding the X beam on the Y beam so as to move along the Y axis such that the head is positioned above the board, and placing the component on the board by the head.

9. A method of placing a component on a board, the method being performed using a component placement machine which comprises:

an X beam which has a bar shape extending along an X axis, the X beam being made of a metal;

a rail which extends along the X axis and slidably guides a head along the X axis, the rail being fastened to one side of the X beam in a direction of a Y axis, the rail being made of a metal which is different from that of the X beam;

a reinforcement member which acts against bending of the X beam, the reinforcement member being made of carbon fiber reinforced plastic, and being installed on another side of the X beam in the direction of the Y axis, the bending being caused by a difference in thermal expansion between the rail and the X beam, the another side of the X beam being a side opposite to the one side of the X beam to which the rail is fastened; and a Y beam which extends along the Y axis and slidably guides the X beam along the Y axis, wherein the rail is fastened to the one side of the X beam with second fasteners at three or more positions arranged along the X axis, and wherein the X beam has a Y-Z cross-section having a shape which is symmetric with respect to the Y axis and has Z-axial width narrowing gradually up to the another side of the X beam in the direction of the Y axis, said method comprising sliding the head, which holds the component, on the rail so as to move along the X axis and sliding the X beam on the Y beam so as to move along the Y axis such that the head is positioned above the board, and placing the component on the board by the head.

* * * * *